United States Patent
Resnick et al.

(10) Patent No.: US 7,874,831 B2
(45) Date of Patent: Jan. 25, 2011

(54) TEMPLATE HAVING A SILICON NITRIDE, SILICON CARBIDE OR SILICON OXYNITRIDE FILM

(75) Inventors: Douglas J. Resnick, Leander, TX (US); Mario Johannes Meissl, Austin, TX (US); Kosta S. Selinidis, Austin, TX (US); Frank Y. Xu, Round Rock, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 12/605,848

(22) Filed: Oct. 26, 2009

(65) Prior Publication Data

US 2010/0040718 A1  Feb. 18, 2010

Related U.S. Application Data

(63) Continuation of application No. 12/130,259, filed on May 30, 2008, now abandoned.

(51) Int. Cl.
*B29C 59/00* (2006.01)
*B29C 33/56* (2006.01)

(52) U.S. Cl. .................. 425/385; 249/115; 264/293

(58) Field of Classification Search .............. 425/385; 264/293; 249/115
See application file for complete search history.

(56) References Cited

U.S. PATENT DOCUMENTS

| 6,387,787 | B1 | 5/2002 | Mancini et al. | |
|---|---|---|---|---|
| 2003/0179693 | A1* | 9/2003 | Ootera | 369/283 |
| 2004/0169003 | A1* | 9/2004 | Lee et al. | 216/4 |
| 2005/0146079 | A1* | 7/2005 | Chou | 264/319 |

* cited by examiner

*Primary Examiner*—Maria Veronica D Ewald
(74) *Attorney, Agent, or Firm*—Laura C. Robinson

(57) ABSTRACT

An imprint lithography template including, inter alia, a body having a first thickness associated therewith; a patterning layer, having a second thickness associated therewith, comprising a plurality of features, having a third thickness associated therewith.

16 Claims, 7 Drawing Sheets

US 7,874,831 B2

TEMPLATE HAVING A SILICON NITRIDE, SILICON CARBIDE OR SILICON OXYNITRIDE FILM

CROSS REFERENCE TO RELATED APPLICATIONS

This application is a Continuation of U.S. patent application Ser. No. 12/130,259 filed on May 30, 2008, which claims priority to U.S. Patent Provisional Application No. 60,940, 737; both of which are hereby incorporated by reference.

BACKGROUND INFORMATION

Nano-fabrication involves the fabrication of very small structures, e.g., having features on the order of nanometers or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as United States patent application publication 2004/0065976 filed as U.S. patent application Ser. No. 10/264,960, entitled "Method and a Mold to Arrange Features on a Substrate to Replicate Features having Minimal Dimensional Variability"; United States patent application publication 2004/0065252 filed as U.S. patent application Ser. No. 10/264,926, entitled "Method of Forming a Layer on a Substrate to Facilitate Fabrication of Metrology Standards"; and U.S. Pat. No. 6,936,194, entitled "Functional Patterning Material for Imprint Lithography Processes," all of which are assigned to the assignee of the present invention.

The imprint lithography technique disclosed in each of the aforementioned United States patent application publications and United States patent includes formation of a relief pattern in a polymerizable layer and transferring a pattern corresponding to the relief pattern into an underlying substrate. The substrate may be positioned upon a stage to obtain a desired position to facilitate patterning thereof. To that end, a patterning device is employed spaced-apart from the substrate with a formable liquid present between the patterning device and the substrate. The liquid is solidified to form a patterned layer that has a pattern recorded therein that is conforming to a shape of the surface of the patterning device in contact with the liquid. The patterning device is then separated from the patterned layer such that the patterning device and the substrate are spaced-apart. The substrate and the patterned layer are then subjected to processes to transfer, into the substrate, a relief image that corresponds to the pattern in the patterned layer.

It may be desirable to properly align the patterning device with the substrate so that a proper orientation between the substrate and the patterning device may be obtained. To that end, both the patterning device and the substrate may include alignment marks. Previous methods of facilitating alignment between the patterning device and the substrate including positioning a moat around the alignment marks to create an air (or gas) gap with a different index of refraction than the patterning device which causes an interface that can be sensed with optical techniques. However, moats maybe undesirable. More specifically, moated alignment marks are not transferred into the pattern on the substrate; moats may consume a large area; moats affect fluid flow and thus cannot be arbitrarily placed within a patterned area; and for flexible patterning devices, moats do not effectively hold the alignment mark region of the patterning device in superimposition with the formable liquid, causing pattern distortions.

DETAILED DESCRIPTION

Figure 1:
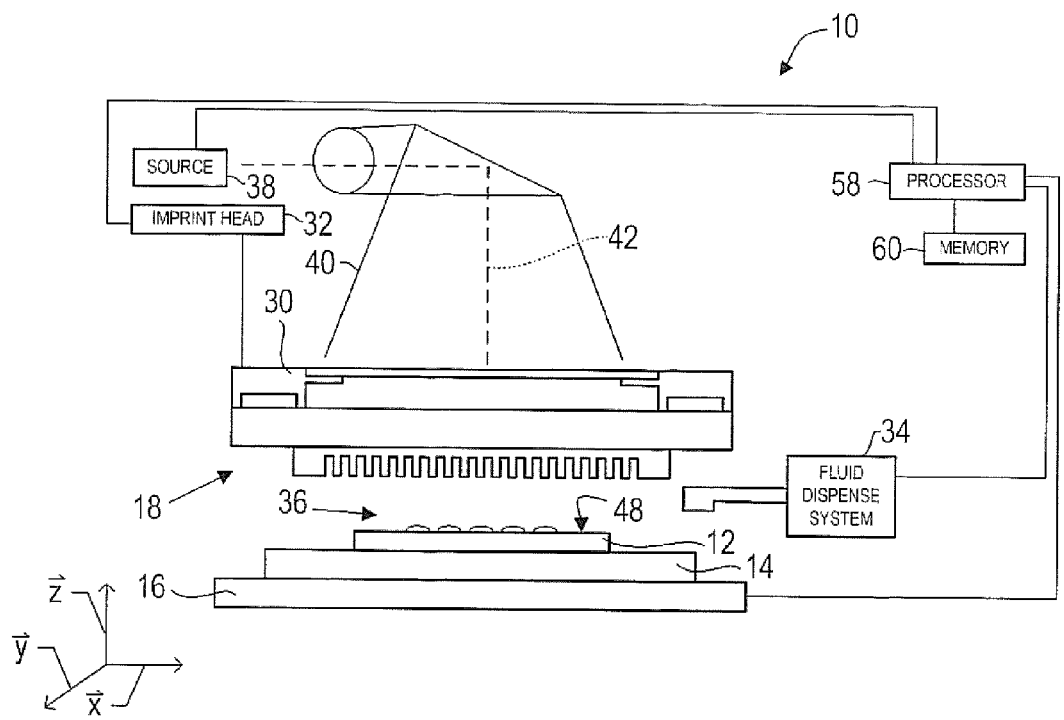
FIG. 1 is a simplified side view of a lithographic system having a patterning device spaced-apart from a substrate.

Referring to FIG. 1, a system 10 to form a relief pattern on a substrate 12 is shown. Substrate 12 may be coupled to a substrate chuck 14. Substrate chuck 14 may be any chuck including, but not limited to, vacuum, pin-type, groove-type, or electromagnetic, as described in U.S. Pat. No. 6,873,087 entitled "High-Precision Orientation Alignment and Gap Control Stages for Imprint Lithography Processes," which is incorporated herein by reference. Substrate 12 and substrate chuck 14 may be supported upon a stage 16. Further, stage 16, substrate 12, and substrate chuck 14 may be positioned on a base (not shown). Stage 16 may provide motion along the x and y axes.

Figure 2:
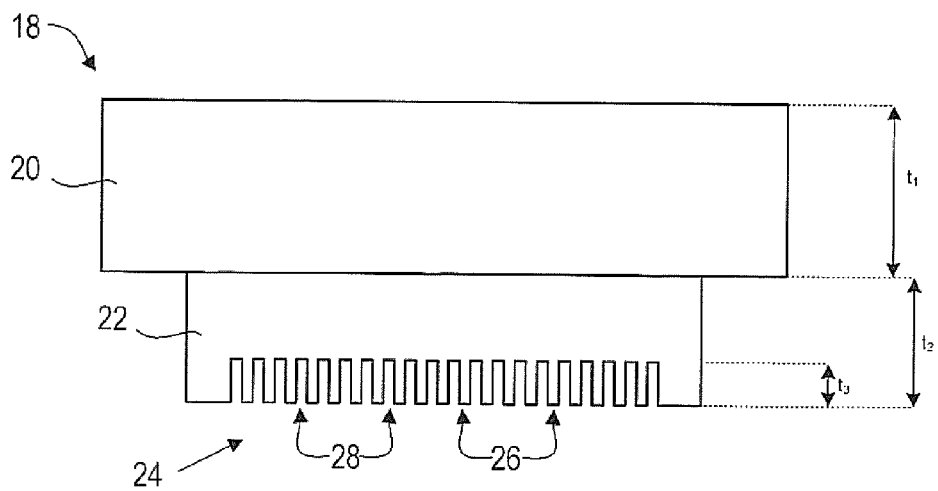
FIG. 2 is a side view of the patterning device shown in FIG. 1.

Referring to FIGS. 1 and 2, spaced-apart from substrate 12 is a patterning device 18. Patterning device 18 may comprise a body 20 and a patterning layer 22. Patterning layer 22 maybe have a plurality of features 24 defined therein, with features 24 including protrusions 26 and recessions 28. In a further embodiment, patterning layer 22 may be substantially smooth and/or planar. Patterning layer 22 may define an original pattern that forms the basis of a pattern to be formed on substrate 12, described further below. Body 20 may comprise fused-silica, however, in a further embodiment, body 20 may be formed from such materials including, but not limited to, quartz, silicon, organic polymers, siloxane polymers, borosilicate glass, fluorocarbon polymers, metal, and hardened sapphire. Patterning layer 22 may be formed from such materials including, but not limited to, silicon nitride, silicon oxynitride, and silicon carbide. Body 20 may have a thickness $t_1$, patterning layer 22 may have a thickness $t_2$, and features 24 may have a thickness $t_3$.

Referring to FIG. 1, patterning device 18 may be coupled to a chuck 30, chuck 30 being any chuck including, but not limited to, vacuum, pin-type, groove-type, or electromagnetic, as described in U.S. Pat. No. 6,873,087 entitled "High-Precision Orientation Alignment and Gap Control Stages for Imprint Lithography Processes." Further, chuck 30 may be coupled to an imprint head 32 to facilitate movement of patterning device 18.

System 10 further comprises a fluid dispense system 34. Fluid dispense system 34 may be in fluid communication with substrate 12 so as to deposit polymeric material 36 thereon. System 10 may comprise any number of fluid dispensers, and fluid dispense system 34 may comprise a plurality of dispensing units therein. Polymeric material 36 may be positioned upon substrate 12 using any known technique, e.g., drop dispense, spin-coating, dip coating, chemical vapor deposition (CVD), physical vapor deposition (PVD), thin film deposition, thick film deposition, and the like. Typically, polymeric material 36 is disposed upon substrate 12 before the desired volume is defined between patterning device 18 and substrate 12. However, polymeric material 36 may fill the volume after the desired volume has been obtained.

Figure 3:
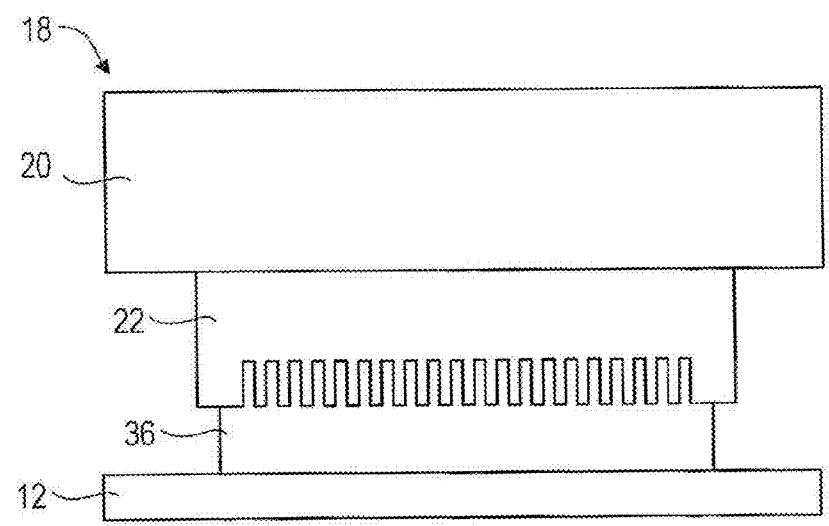
FIG. 3 is a side view of the patterning device contacting a polymeric material positioned on the substrate, all shown in FIG. 1.

System 10 further comprises a source 38 of energy 40 coupled to direct energy 40 along a path 42. Source 38 may produce ultraviolet energy. However, other energy sources may be employed, such as thermal, electromagnetic, visible light and the like. The selection of energy employed to initiate polymerization of polymeric material 36 is known to one skilled in the art and typically depends on the specific application which is desired. Imprint head 30 and stage 16 are configured to arrange patterning device 18 and substrate 12, respectively, to be in superimposition and disposed in path 42. Either imprint head 30, stage 16, or both vary a distance between patterning device 18 and substrate 12 to define a desired volume therebetween that is filled by polymeric material 36, as shown in FIG. 3. Furthermore, an alignment between patterning device 18 and substrate 12 may be desired. Ascertaining a desired alignment between patterning device 18 and substrate 12 facilitates pattern transfer between patterning device 18 and substrate 12.

Figure 4:
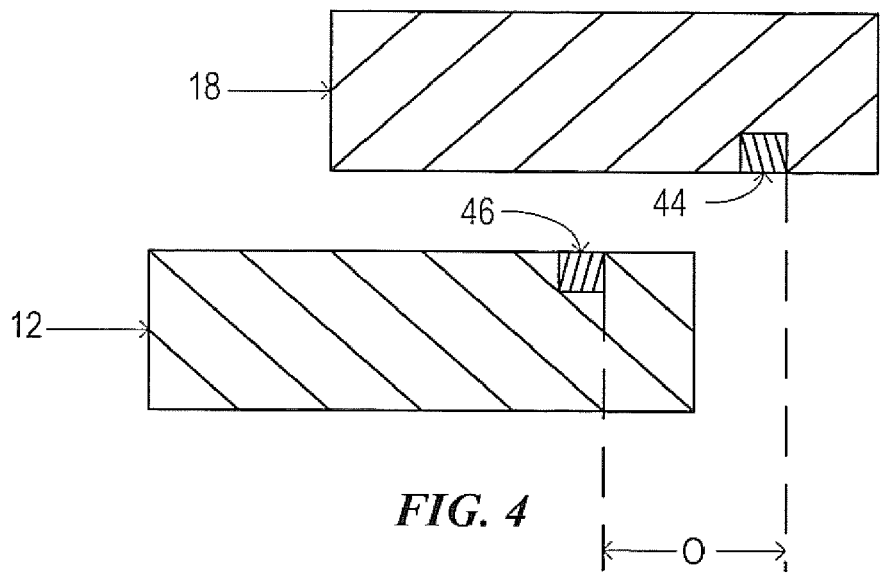
FIG. 4 is a simplified elevation view of the patterning device in superimposition with the substrate, both shown in FIG. 1, showing misalignment along one direction.
Figure 5:
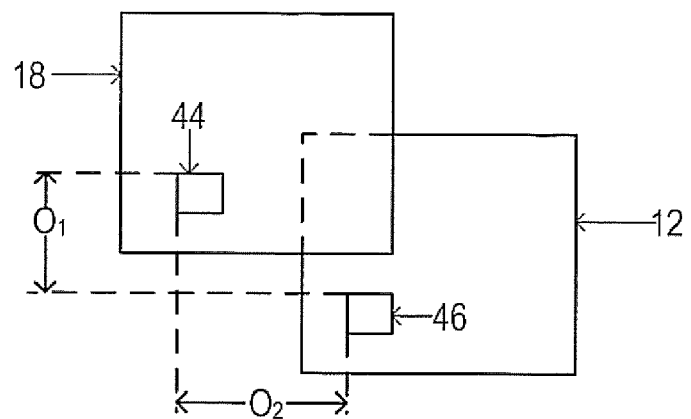
FIG. 5 is a top clown view of the patterning device in superimposition with the substrate, both shown in FIG. 1, showing misalignment along two transverse directions.
Figure 6:
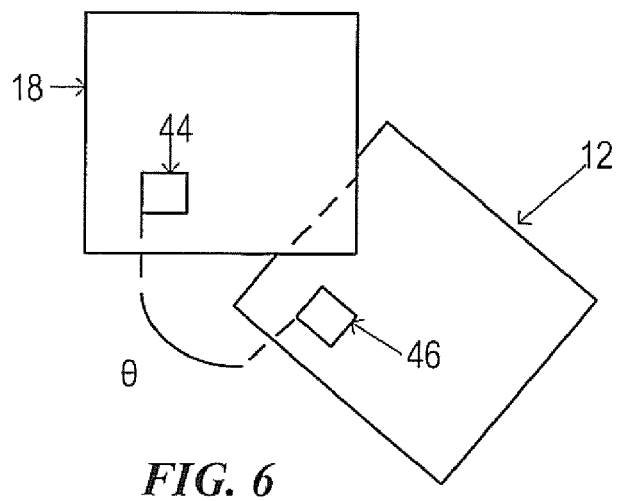
FIG. 6 is a top down view of the patterning device in superimposition with the substrate, both shown in FIG. 1, showing angular misalignment.

Referring to FIG. 4, to facilitate the above-mentioned alignment of patterning device 18 and substrate 12, patterning device 18 may include alignment marks 44, and substrate 12 may include alignment marks 46. In the present example, it is assumed that desired alignment between patterning device 18 and substrate 12 occurs upon alignment mark 44 being in superimposition with alignment mark 46. As shown in FIG. 4, desired alignment between pattering device 18 and substrate 12 has not occurred, shown by the two marks being offset a distance O. Further, although offset O is shown as being a linear offset in one direction, it should be understood that the offset may be linear along two directions shown as $O_1$ and $O_2$, as shown in FIG. 5. In addition to, or instead of, the aforementioned linear offset in one or two directions, the offset between patterning device 18 and substrate 12 may also consist of an angular offset, shown in FIG. 6 as angle θ. Multiple alignment masks may also have other offsets in combination (e.g., magnification, skew, and trapezoidal distortions).

Figure 7:
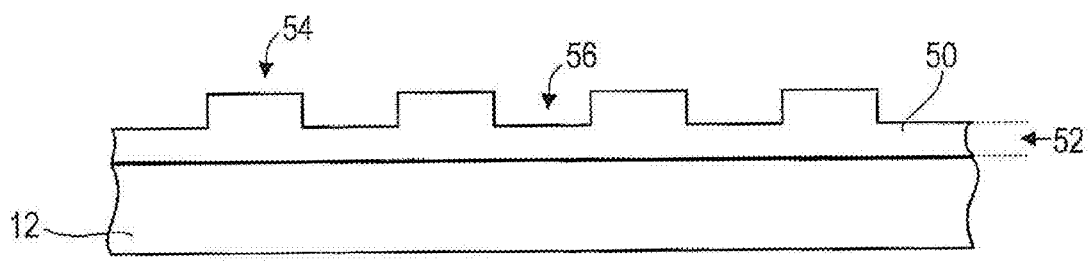
FIG. 7 is a simplified side view of the substrate shown in FIG. 1, having a patterned layer thereon.

Referring to FIGS. 1 and 7, after the desired volume is filled with polymeric material 36 and a desired alignment between patterning device 18 and substrate 12 is obtained, source 38 produces energy 40, e.g., broadband ultraviolet radiation that causes polymeric material 36 to solidify and/or cross-link conforming to the shape of a surface 48 of substrate 12 and patterning device 18, defining a patterned layer 50 on substrate 12. Patterned layer 50 may comprise a residual layer 52 and protrusions 54 and recessions 56. In a further embodiment, after forming patterned layer 50, the pattern of patterned layer 50 may be transferred into substrate 12 or an underlying layer (not shown) or used as a functional material.

System 10 may be regulated by a processor 58 that is in data communication with stage 16, imprint head 30, fluid dispense system 34, and source 38, operating on a computer readable program stored in memory 60.

Referring to FIGS. 1 and 2, to that end, as mentioned above, an alignment between substrate 12 and patterning device 18 may be desired. To facilitate the alignment, it may be desired to increase a contrast between patterning device 18 and polymeric material 36 positioned on substrate 12 and, as a result, in-liquid alignment between substrate 12 and patterning device 18 may be achieved. To increase the contrast between patterning device 18 and polymeric material 36, patterning layer 22 of patterning device 18 may be formed from such materials including, but not limited to, silicon nitride, silicon oxynitride, and silicon carbide, as mentioned above. However, thickness $t_2$ of patterning layer 22 may be selected to minimize, if not prevent, distortions within patterning layer 22, described further below.

Figure 8:
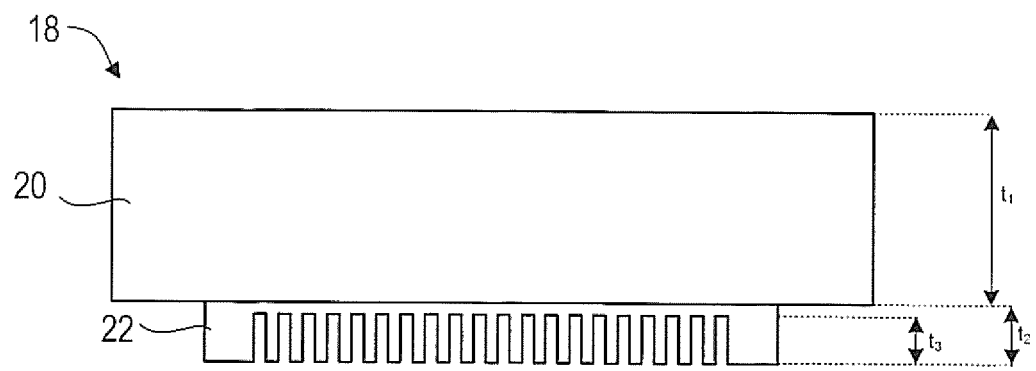
FIG. 8 is a side view of the patterning device shown in FIG. 1, having a thin film.

Referring to FIG. 8, a magnitude of thickness $t_2$ of patterning layer 22 may result in thin film distortions of patterning layer 22. More specifically, during formation of patterning layer 22, patterning layer 22 maybe subjected to an etching process to remove portions thereof to define features 24 therein. However, when thickness $t_2$ of patterning layer 22 has a magnitude within a range of <20 of thickness $t_3$ of features 24, stress relief may be induced within patterning layer 22 resulting in thin film stress distortion of patterning layer 22, which is undesirable. This is a result of removing portions of patterning layer 22 during etching to define features 24 having a significant size compared to thickness $t_2$ of patterning layer 22 (i.e. thickness $t_3$ of features 24). Further, as a result of thickness $t_1$ of body 20 being substantially greater than thickness $t_2$ of patterning layer 22, thermal distortions may be small.

Figure 9:
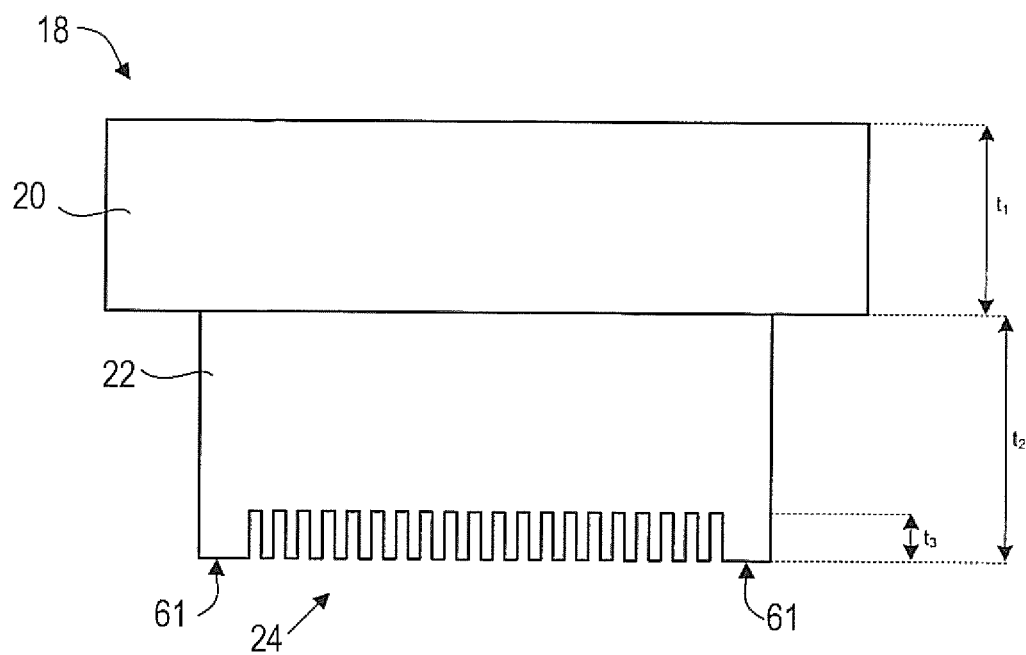
FIG. 9 is a side view of the patterning device shown in FIG. 1, having a thick film.

Referring to FIG. 9, furthermore, a magnitude of thickness $t_2$ of patterning layer 22 may result in thermal distortions of patterning layer 22. More specifically, when thickness $t_2$ of patterning layer 22 has a magnitude within a range of $>1/350$ of thickness $t_1$ of body 20, a far field distortion of patterning device 18 may result as a result of thermal expansion differences of the materials comprising body 20 and patterning layer 22. The aforementioned thermal distortion may cause a tension or a compression effect at an interface of body 20 and patterning layer 22 with nonlinear distribution over features 24, with a maximum distortion at a perimeter 61 of patterned layer 22. Furthermore, the aforementioned thermal distortions may cause an out-of-plane bending effect of patterning device 18 that may further increase an in-plane distortion prior to patterning device 18 is in full contact with polymeric material 36 on substrate 12, such as during proximity alignment. However, as a result of thickness $t_2$ of patterning layer 22 being substantially greater than thickness $t_3$ of features 24, localized distortions from etching patterns may be small.

Referring to FIG. 2, to that end, it may be desired to have thickness $t_2$ of patterning layer 22 have a thickness or a range of layer thicknesses to minimize, if not prevent, both thin film distortions and thermal distortions of patterning layer 22, mentioned above. More specifically, thickness $t_2$ of patterning layer 22 may be defined as:

$$c_1 \times t_3 < t_2 < t_1/c_2 \qquad (1)$$

wherein $c_1$ and $c_2$ are defined to result in greater stability to etch-based stress relief distortion and thermal distortions of patterning layer 22, wherein $c_1$ may be greater than 20 and $c_2$ may be greater than 350. In an example of pattering device 18, for body 20 having thickness $t_1$ of 700 μm and features 24 having thickness $t_3$ of 100 nm, thickness $t_2$ of patterning layer 22 may be 2 μm. In a further example of patterning device 18, for body 20 having thickness $t_1$ of 0.7 mm to 6.35 mm and features 24 having thickness $t_3$ of 100 nm, thickness $t_2$ of patterning layer 102 may have a range of 100 nm-5 µm, depending on thin film stresses during deposition of patterning layer 22 and the relative thermal expansion coefficient of the specific composition of patterning layer 22 compared to the composition of body 20.

Figure 10A:
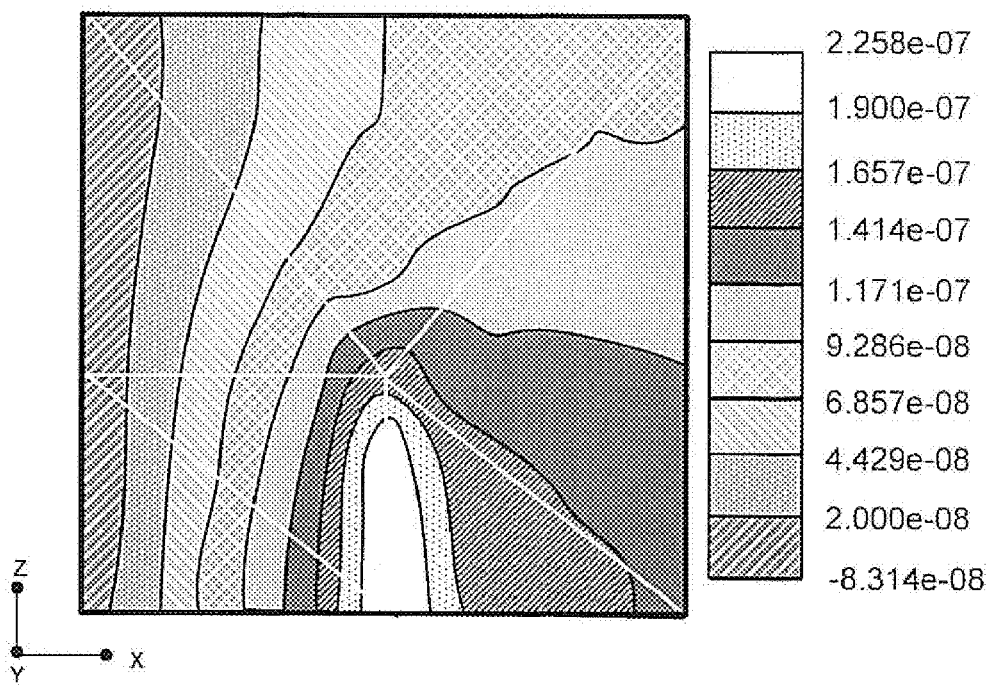
FIGS. 10*a* and 10*b* are a first example of a distortion plot.
Figure 10B:
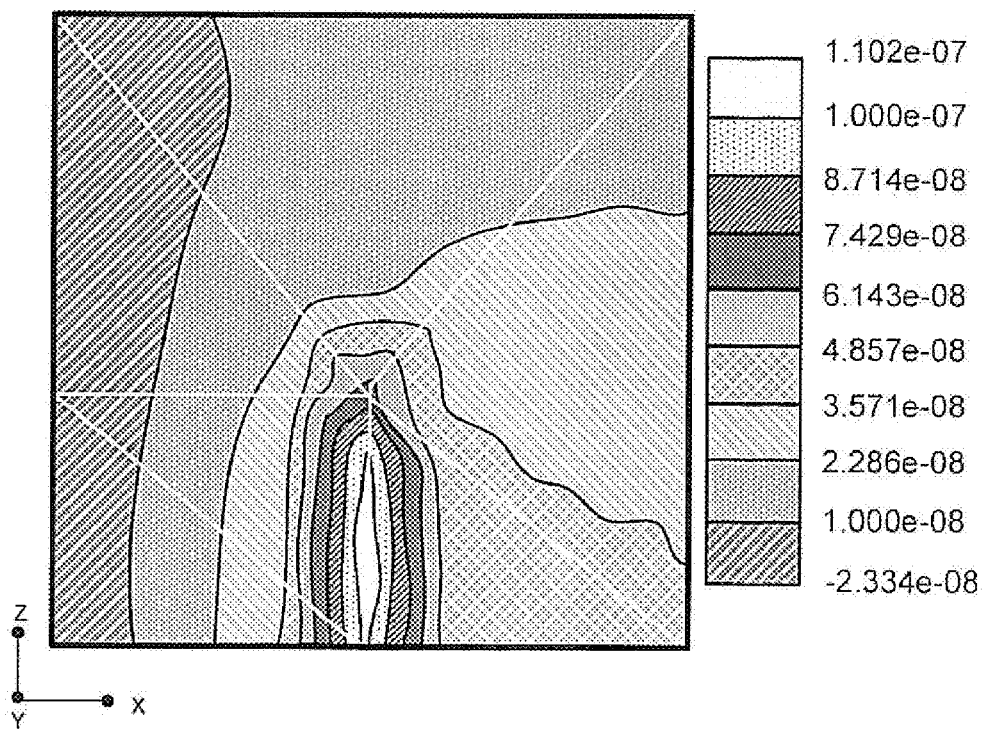
Figure 11A:
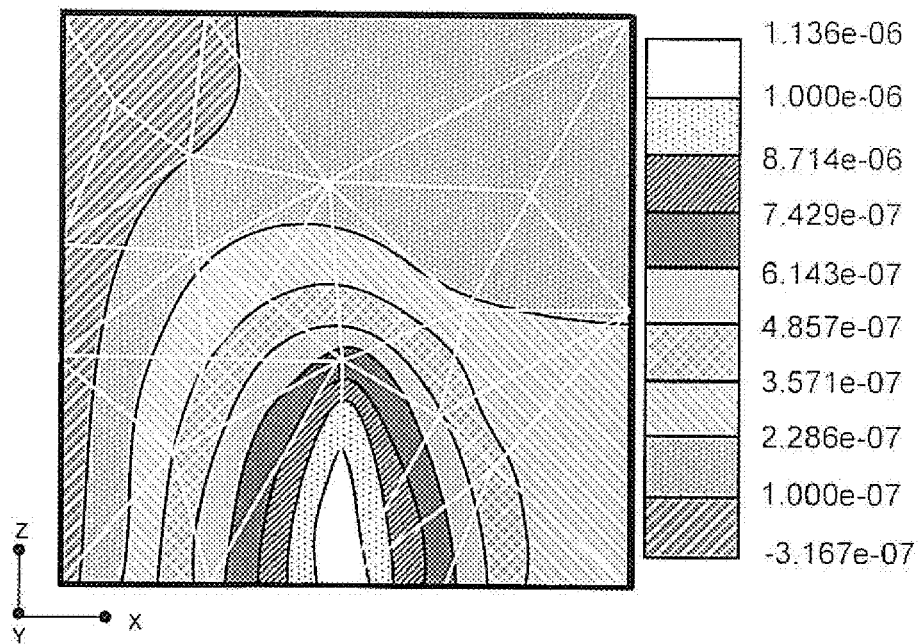
FIGS. 11*a* and 11*b* are a second example of a distortion plot.
Figure 11B:
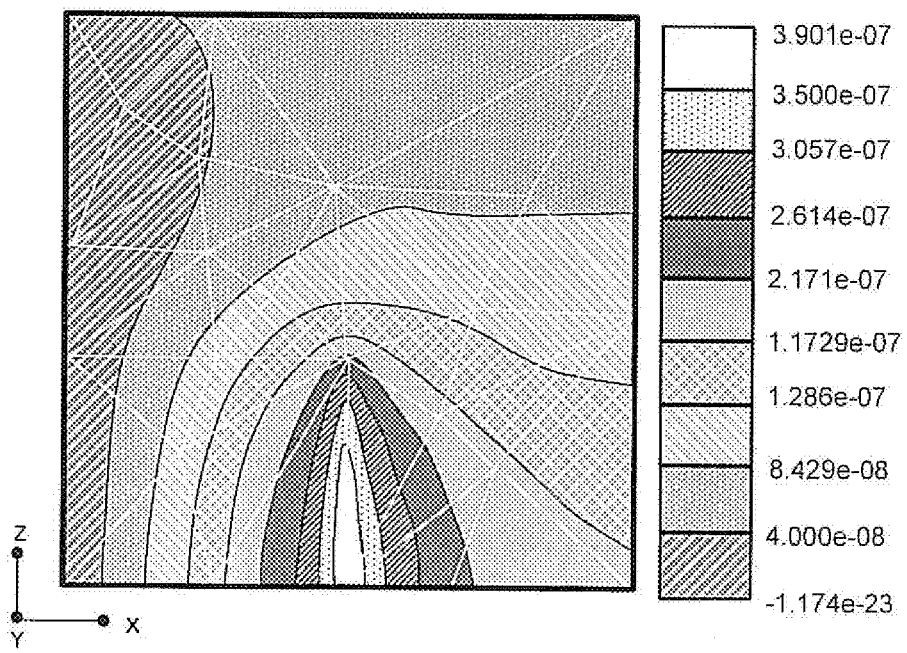

Exemplary x-direction distortion plots for patterning layer 22 having thickness $t_2$ of 2 µm and a composition of silicon nitride are shown in FIGS. 10a, 10b, 11a, and 11b. FIGS. 10a and 10b are 2 micron film distortion on body 20 where thickness $t_1$ is 6.35 mm for 1° C., $E_{film}$=300 GPa, and $CTE_{film}$=3.5 ppm/° C., with FIG. 10a being free to bend and δx max=0.23 nm and FIG. 10b being held flat and δx max=0.11 nm. FIGS. 11a and 11b are 2 micron film distortion on body 20 where thickness $t_1$ is 0.700 micron for 1° C., $E_{film}$=300 GPa, and $CTE_{film}$=3.5 ppm/° C., with FIG. 6a being free to bend and δx max=1.1 nm and FIG. 6b being held flat and δx max=0.39 nm.

Figure 12:
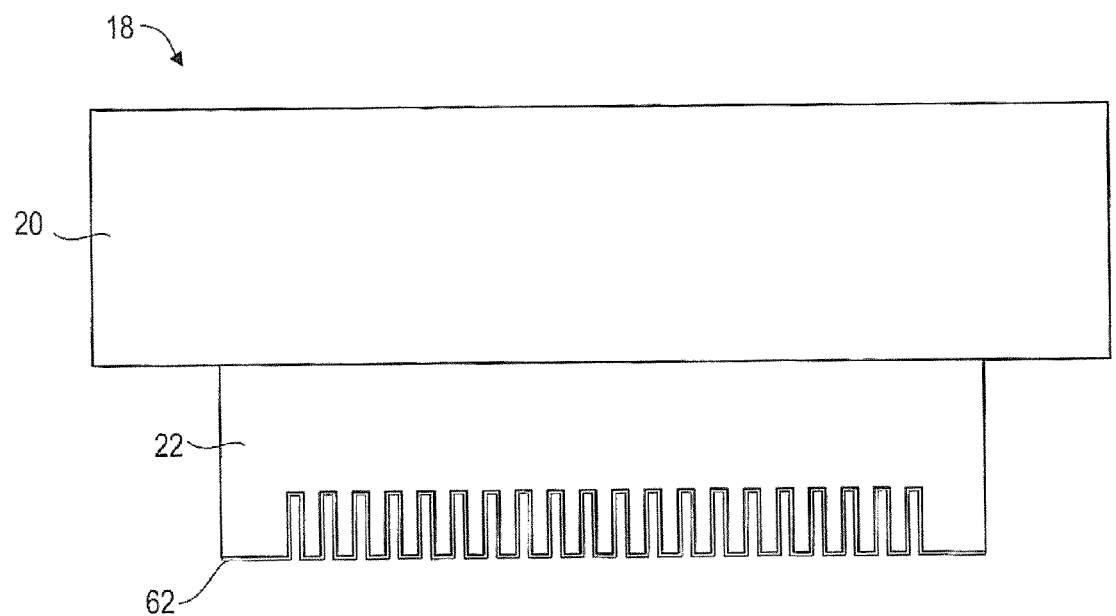
FIG. 12 is a side view of the patterning device shown in FIG. 1, having a layer positioned thereon.

Referring to FIG. 12, in a further embodiment, a layer 62 may be positioned upon patterned layer 22. Layer 62 may facilitate separation from polymeric material 36 and/or wetting of polymeric material 36. In still a further embodiment, layer 62 may comprise an oxide.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalents.

What is claimed is:

1. An imprint lithography template comprising:
   an imprint lithography template body having a first thickness associated therewith; and,
   an imprint lithography template patterning layer, having a second thickness associated therewith, the imprint lithography template patterning layer having a plurality of features, the features having a third thickness associated therewith, the patterning layer comprising a material selected from a set of materials consisting of silicon nitride, silicon oxynitride, and silicon carbide,
   wherein the second thickness is defined by:

$$c_1 \times a < t < d/c_2$$

wherein d is said first thickness, t is said second thickness, a is said third thickness and $c_1$ is greater than 20 and $c_2$ is greater than 350.

2. The template of claim 1, wherein the plurality of features includes a plurality of protrusions and recessions.

3. The template of claim 1, further comprising an over-coat layer, with the imprint lithography template patterning layer being positioned between the imprint lithography template body and the over-coat layer, with the over-coat layer facilitating separation from a material in contact with the imprint lithography template.

4. The template of claim 1, further comprising an over-coat layer, with the imprint lithography template patterning layer being positioned between the imprint lithography template body and the over-coat layer, with the over-coat layer facilitating wetting of a material in contact with the imprint lithography template.

5. The template of claim 1, wherein the second thickness has a magnitude such that stress and thermal distortions thereof are minimized.

6. The template of claim 1, wherein the second thickness has a magnitude of about 100 nm-5 µm.

7. The template of claim 1, wherein the imprint lithography patterning layer is adapted to have a different index of refraction than material in contact with the imprint lithography template.

8. An imprint lithography template for patterning polymerizable material deposited on a substrate, comprising:
   a body, and,
   a patterning layer, the patterning layer comprising a material selected from a set of materials consisting of silicon nitride, silicon oxynitride, and silicon carbide, wherein the patterning layer is adapted to have a different index of refraction than the polymerizable material, wherein the body has a first thickness, the patterning layer has a second thickness, and the patterning features have a third thickness the first, second and third thicknesses being different; the second thickness is defined by:

$$c_1 \times a < t < d/c_2$$

wherein d is said first thickness, t is said second thickness, a is said third thickness and $c_1$ is greater than 20 and $c_2$ is greater than 350.

9. The template of claim 8, further comprising an over-coat layer, with the patterning layer being positioned between the body and the over-coat layer, with the over-coat layer facilitating separation from a material in contact with the imprint lithography template.

10. The template of claim 8, further comprising an over-coat layer, with the patterning layer being positioned between the body and the over-coat layer, with the over-coat layer facilitating wetting of a material in contact with the imprint lithography template.

11. The template of claim 8, wherein the patterning layer includes patterning features.

12. The template of claim 8, wherein the second thickness has a magnitude adapted to minimize stress and thermal distortions.

13. The template of claim 8, wherein the second thickness has a magnitude of about 100 nm-5 µm.

14. An imprint lithography template, comprising:
    a body;
    a patterning layer having a plurality of features; the patterning comprising a material selected from a set of materials consisting of silicon nitride, silicon oxynitride, and silicon carbide, wherein the material has a different index of refraction than material in contact with the imprint lithography template wherein the body has a first thickness, the patterning layer has a second thickness, and the features have a third thickness the first, second and third thicknesses being different; the second thickness is defined by:

$$c_1 \times a < t < d/c_2$$

wherein d is said first thickness, t is said second thickness, a is said third thickness and $c_1$, is greater than 20 and $c_2$ is greater than 350.

15. The imprint lithography template of claim 14, further comprising an over-coat layer, with the patterning layer being positioned between the body and the over-coat layer, with the over-coat layer facilitating separation from a material in contact with the imprint lithography template.

16. The imprint lithography template of claim 14, further comprising an over-coat layer, with the patterning layer being positioned between the body and the over-coat layer, with the over-coat layer facilitating wetting of the material in contact with the imprint lithography template.

* * * * *